United States Patent [19]

Huignard et al.

[11] 4,063,795
[45] Dec. 20, 1977

[54] ELECTRO-OPTIC HOLOGRAPHIC STORAGE DEVICE HAVING UNLIMITED RECORD-ERASE CAPABILITY

[75] Inventors: Jean Pierre Huignard; Jean Pierre Herriau; François Micheron, all of Paris, France

[73] Assignee: Thomson-CSF, Paris, France

[21] Appl. No.: 687,628

[22] Filed: May 18, 1976

[30] Foreign Application Priority Data

May 23, 1975   France ................. 75.16063

[51] Int. Cl.² .............. G02B 27/00; G11C 11/42
[52] U.S. Cl. .............................. 350/3.5; 365/125
[58] Field of Search ............ 350/3.5; 340/173 LM, 340/173 LT

[56] References Cited

U.S. PATENT DOCUMENTS

| 3,652,145 | 3/1972 | Thaxter ...................... 350/3.5 |
| 3,703,328 | 11/1972 | Glass et al. ................. 350/3.5 |
| 3,978,458 | 8/1976 | Vergnolle et al. ....... 340/173 LM X |

OTHER PUBLICATIONS

Chen et al., "Holographic Storage in Lithium Niobate," *Applied Physics Letters,* vol. 13, No. 7, Oct. 1968, pp. 223-225.
Phillips et al., "Optical and Holographic Storage Properties of...", *RCA Review,* vol. 33, Mar. 1972, pp. 94-109.
Huignard et al., "Coherent Selective Erasure of Superimposed...," *Applied Physics Letters,* vol. 26, No. 5, Mar. 1975, pp. 256-258.
Huignard et al., "Control of Sensitivity to Hologram Storage in LiNbO₃...", *Optics Communications,* vol. 16, No. 1, Jan. 1976, pp. 80-82.

*Primary Examiner*—Ronald J. Stern
*Assistant Examiner*—John D. Lee
*Attorney, Agent, or Firm*—Cushman, Darby & Cushman

[57] ABSTRACT

The present invention relates to a holographic optical storage device utilizing a material in which the transfer of photo-induced charges is orientated along the cristallographic axis $\vec{C}$ of the material. On the faces of the material perpendicular to said axis, two transparent electrodes connected together are arranged so that the field developed between said two faces is zero whatever the uniform illumination superimposed upon the modulation. The selective erasing of a first induced spatial variation in refractive index is achieved by recording a second spatial variation which is the complement of the first, the number of successive record-erase cycles being unlimited.

4 Claims, 3 Drawing Figures

ELECTRO-OPTIC HOLOGRAPHIC STORAGE DEVICE HAVING UNLIMITED RECORD-ERASE CAPABILITY

The present invention relates to a three dimensional holographic storage device. Electro-optical photosensitive materials, in particular ferro-electric crystals, are adapted to three-dimensional holographic storage functions because the BRAGG effect, of angular selectivity, can be used there. This storage is carried out by superimposing elementary holograms in the crystal. In this way, a very high storage density is achieved.

The read-out of elementary holograms is performed by illumination using coherent optical radiation, for example the reference beam which has been used at the time of recording. In order that this read-out, or recording in a neighbouring zone, does not give rise to erasing of the recorded hologram, it is necessary that the spatial variation in refractive index previously produced, should not be substantially modified by this kind of uniform radiation. Materials suitable for multiple optical storage must therefore have a highly asymmetrical record-erase cycle.

For materials of this kind, the conventional recording method involves a uniform variation in refractive index in that zone of the crystal which is subject to interference between the object beam and the reference beam, upon which there is superimposed the spatial variation in refractive index.

The corresponding erase method consists in superimposing upon the spatial variation in refractive index produced at the time of recording, a phase-shifted spatial variation in refractive index of amplitude substantially equal to the former, these two consecutive variations bringing the refractive index to a constant value throughout the thus erased zone.

However, the uniform variation in refractive index corresponding to this fresh recording, is superimposed upon that already produced at the time of the first recording.

After a certain number of these record-erase cycles, the mean refractive index of the material having reached its peak value, the material is saturated and it is no longer possible to record there fresh spatial variations of refractive index.

According to the invention there is provided a three dimensional holographic optical storage device comprising a crystal with a prior refractive index, having a transfer axis, for storing information in elementary zones, said crystal being adapted for liberating charges under photoexcitation and for creating, by oriented transfer of said charges along said transfer axis, a spatial field variation inducing a spatial variation in refractive index, electrodes arranged on said crystal adapted for short-circuiting each of said elementary zones, said field variation developed along said transfer axis in each of said elementary zones being solely an alternating one and said spatial variation in refractive index taking place around said prior refractive index.

For a better understanding of the invention and to show how the same may be carried into effect, reference will be made to the following description and the attached drawings among which:

The sensitivity of a doped and reduced photosensitive electro-optical material to uniform illumination, is a function of the reduction ratio of the crystal.

For a reduced and ironed-doped lithium-niobate crystal, this sensitivity is a function of the ratio of $Fe^{3+}$ ions to $Fe^{2+}$ ions obtained by reduction.

The materials which are suitable for three-dimensional storage are therefore materials having an asymmetrical cycle, obtained by high doping and by weak reduction of a photosensitive electro-optical crystal in such a fashion that it retains good optical properties.

When illuminated by a network of interference fringes, an orientated charge transfer is produced, the transfer of $Fe^{2+}$ towards the $Nb^{+5}$ ions in the case of ironed-doped lithium niobate ; the space charge field thus created, modulates the refractive index of the material by the electro-optical effect. However, since the illumination has a continuous component, the distribution of the luminous intensity in the direction of transfer of the charges can be put in the form :

$$I = I_o(1 + m \cos K\ x)$$

where $I_o$ is the continuous intensity, $m$ the modulation ratio and $K = 2\pi/\Omega$, $\Omega$ being the pitch of the interference fringes.

This intensity distribution creates a space charge field at the same time spatial frequency K as the light distribution, this field E (x) being equal to:

$$E(x) = E_o + \delta E \cos(Kx + \phi)$$

where $E_o$ is the space charge field developed by the uniform illumination $I_o$, $\delta E$ is the amplitude of the alternating field corresponding to the spatial variation in intensity and $\phi$ is the possible displacement, along the charge transfer axis $\vec{C}$, of the space charge field in relation to the light intensity distribution.

The photo-induced voltage developed across the terminals of the recording zone in the direction of the axis $\vec{C}$ of the crystal is given by $$V = \int E(x)\ dx = E_o L, \text{ where } L \text{ is the length of the zone.}$$

This voltage corresponds with mean optical damage and therefore with a non-zero mean variation in refractive index.

The majority of doped and reduced ferroelectric materials operating at a temperature of below their Curie temperature, have an induced double-refracting characteristic, as a function of the electric field developed, which is linear up to a value $n_s$ corresponding to the saturation index of the material.

Figure 1:
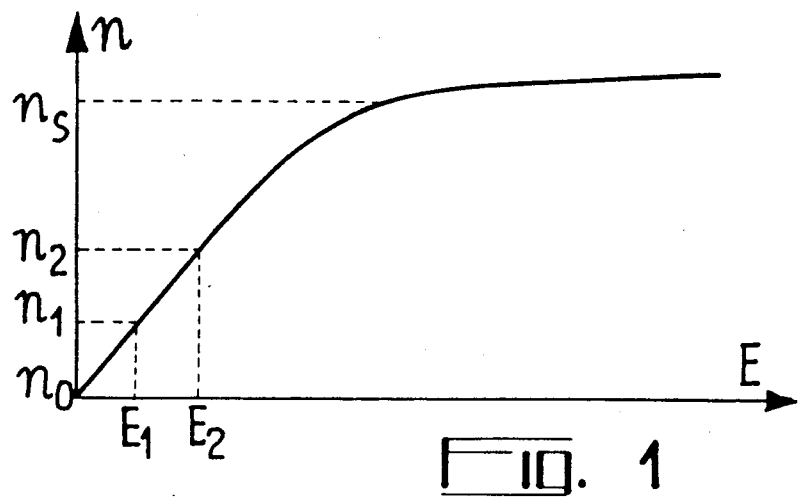
FIG. 1 illustrates the variation in refractive index in the material as a function of the field developed there.

This kind of characteristic has been shown in FIG. 1.

To erase the first recording, interference fringes offset by $\pi$ are created in the same zones ; the alternating space charge fields cancel each other, but the continuous field corresponding to the mean illumination increases.

Figure 2:
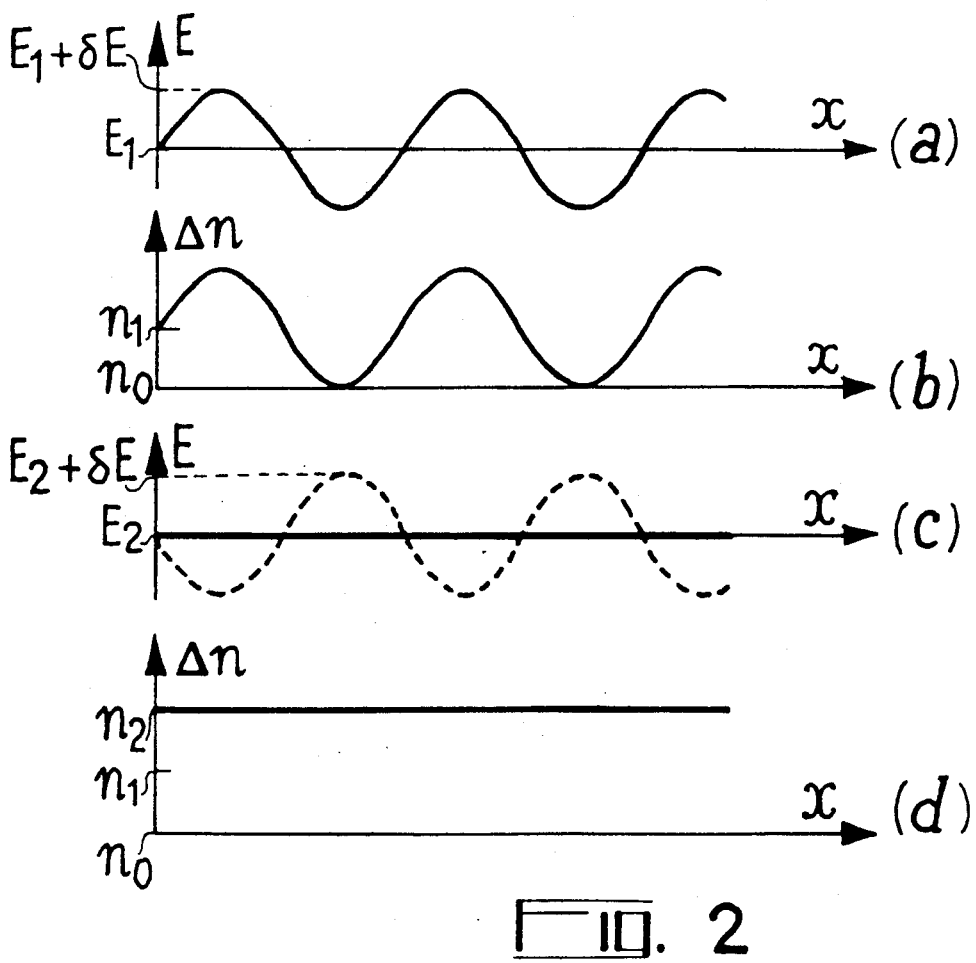
FIG. 2 illustrates graphs explaining the variations in field and refractive index, after illumination by a network of interference fringes.

These phenomena have been shown in FIG. 2. The graph (a) illustrates the space charge field created at the time of first recording and the graph (b) illustrates the corresponding variation in refractive index centered around the mean value $n_1$. The graph (c) illustrates in dashed fashion the space charge field which would be created with a first recording, whilst the full line gives the value $E_2 = 2E_1$ corresponding to the resultant continuous field.

The resultant refractive index is constant but equal to $n_2$, graph (d). If, on the other hand, the recording zone is short-circuited along the same axis $\vec{C}$, the space charge field which can be photo-induced establishes around a zero mean component in order to satisfy the condition on the limits imposed by the short-circuit, and the potential difference in this zone is given by :

$$U = \int E(x)\, dx = 0.$$

This field is therefore $E = \delta E \cos(Kx + \phi)$ using the same notations as before.

Under these circumstances, the photo-induced modulation of the refractive index establishes around the normal refractive index of the material. For a fresh recording phase-shifted by $\pi$, the space charge field establishes around zero and precisely cancels out the charge field previously created.

The material therefore reverts to its normal refractive index $n_o$.

The number of record-erase cycles is therefore no longer limited by the saturation refractive index of the material, previously produced by increase in the continuous field.

Figure 3:
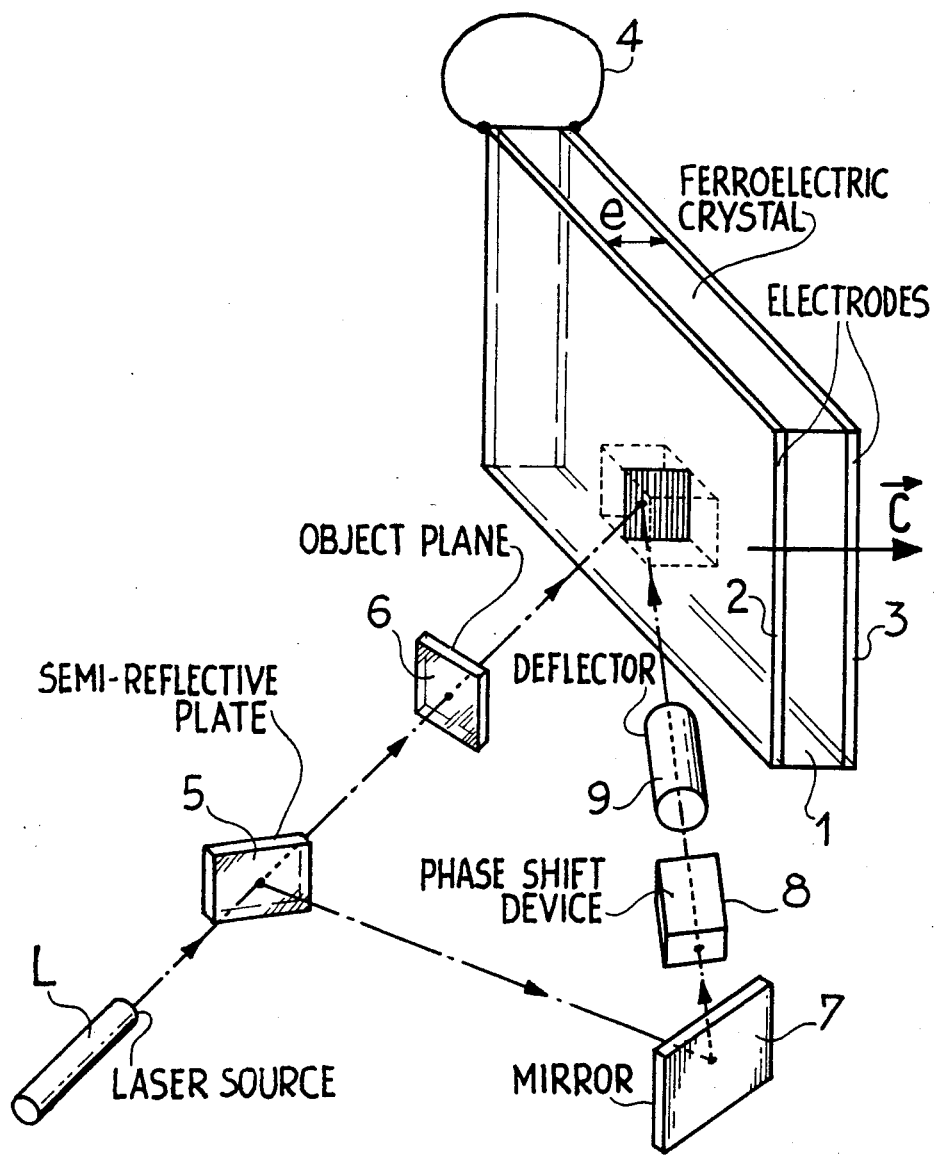
FIG. 3 illustrates the three-dimensional holographic storage device in accordance with the invention.

FIG. 3 illustrates an embodiment of the three-dimensional holographic storage device in accordance with the invention.

The variations in refractive index being photo-induced in the direction of the axis $\vec{C}$ of the crystal, if said axis is parallel to the major face of the crystal, it is difficult to short-circuit the elementary recording zones at said surface. The crystal used for the recording material in the device in accordance with the invention therefore has its crystallographic axis disposed perpendicularly to its major faces.

On the major faces of the crystal 1 there are arranged two transparent electrodes 2 and 3 connected by a conductor wire 4. The elementary recording zones have a longitudinal dimension corresponding to the thickness $e$ of the crystal, the fringes created in the crystal being perpendicular to the axis $\vec{C}$. The double-refracting effect is at a maximum when the bisector of the angle made between the optical axes of the object beam and the reference beam, is substantially perpendicular to the crystallographic axis. This condition cannot be realised but it can be approximated to by making the angle between said bisector and the major faces of the crystal, small. In FIG. 3, a laser source L emits luminous radiation. Part of this radiation, constituting the object beam, passes through a semi-reflective plate 5 and then illuminates the object plane 6, whilst the other part is reflected by the plate 5 onto a mirror 7. The thus reflected radiation passes through a phase-shift device 8 with two phase-shift positions, O and $\pi$, and the reference beam thus obtained is suitably orientated by means of a deflector 9. In the drawing, only the optical axes of the object beam and the reference beam have been shown, the bisector of the angle thus formed having a substantial component parallel to the major faces of the crystal and a small component along the crystallographic axis $\vec{C}$.

Recording is performed in conventional fashion by the creation of a space charge field, but as indicated earlier the two major faces are short-circuited so that no field is developed across the terminals of the recording zones and the modulation of the refractive index is effected around the refractive index $n_o$ of the unilluminated material.

For erase purposes, the object plane being the same, the reference beam is phase-shifted by $\pi$ using the phase-shift device 8, the angle of incidence of the reference beam remaining unchanged. The network of fringes creates a space charge field which is opposed to the previous one and this introduces a modulation of refractive index which is opposed to the former one, around the same mean value $n_o$.

This second recording therefore precisely cancels out the effects of the first one. The phase-shift device arranged in the path of the reference beam could equally well be arranged in the path of the object beam.

The invention is not limited to the device described and illustrated here. In particular, provided that the elementary recording zones are short-circuited, any other arrangement can be used.

What we claim is:

1. A three dimensional holographic optical storage device comprising a crystal with a prior refractive index, having a transfer axis, for storing information in elementary zones, said crystal being adapted for liberating charges under photoexcitation and for creating, by oriented transfer of said charges along said transfer axis, a spatial field variation inducing a spatial variation in refractive index, electrodes arranged on said crystal interconnected to short-circuit each of said elementary zones during recording and erasing with no external field applied, said field variation developed along said axis of transfer in each of said elementary zones being solely an alternating one and said spatial variation in refractive index taking place around said prior refractive index.

2. An optical storage device as claimed in claim 1, wherein said transfer axis is parallel to the smallest dimension of said crystal, two transparent electrodes being connected together and arranged on those faces of said crystal which are perpendicular to said transfer axis.

3. An optical storage device as claimed in claim 2, wherein said crystal is a highly iron doped lithium niobate crystal, the charge transfer axis being the crystallographic axis $\vec{C}$ of said crystal.

4. An optical storage device comprising a crystal adapted for storing information in elementary zones which are short circuited, a coherent radiation source, first optical means splitting the radiation into an object beam and a reference beam, a device for optically modulating said object beam, a device for orientating said reference beam and a phase-shift device producing phase-shift in one of the two said beams, the phase-shift being zero during a first storage of information inducing variation in the refractive index and equal to $\pi$ during a second storage thereof which erases the first, the intersection between the modulated object beam and the reference beam being performed in a short-circuited elementary zone with no external field applied.

* * * * *